(12) United States Patent
Kosonen

(10) Patent No.: US 6,384,757 B1
(45) Date of Patent: May 7, 2002

(54) METHOD OF CALIBRATING AN ANALOG-TO-DIGITAL CONVERTER, AND A CALIBRATION EQUIPMENT

(75) Inventor: Paavo Kosonen, Helsinki (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/860,393

(22) Filed: May 18, 2001

Related U.S. Application Data

(63) Continuation of application No. PCT/FI00/00790, filed on Sep. 19, 2000.

(30) Foreign Application Priority Data

Sep. 20, 1999 (FI) .............................................. 19992001

(51) Int. Cl.[7] .................................................. H03M 1/10
(52) U.S. Cl. ..................................... 341/120; 341/155
(58) Field of Search ................................ 341/120, 121, 341/118, 151, 161

(56) References Cited

U.S. PATENT DOCUMENTS

| | | | |
|---|---|---|---|
| 5,500,644 A | * | 3/1996 | Dejean ........................ 341/120 |
| 5,635,937 A | | 6/1997 | Lim et al. |
| 5,677,692 A | | 10/1997 | Hasegawa |
| 5,870,041 A | | 2/1999 | Lee et al. |
| 6,057,891 A | * | 5/2000 | Guerin ........................ 341/155 |

FOREIGN PATENT DOCUMENTS

| | | |
|---|---|---|
| EP | 0 981 204 | 2/2000 |
| WO | WO 94/27373 | 11/1994 |
| WO | WO 99/29042 | 6/1999 |

\* cited by examiner

*Primary Examiner*—Brian Young
(74) *Attorney, Agent, or Firm*—Altera Law Group, LLC

(57) ABSTRACT

A calibration equipment for calibrating an analog-to-digital converter, which calibration equipment comprises means for supplying control codes to the analog-to-digital converter, whereupon a digital value is obtained as the output of the converter, means for calculating a residual of the voltage sector to be calibrated as a difference of the second and the first digital value, means for calculating a correction term related to the voltage sector by adding the correction term of the adjacent calibrated voltage sector to the residual of the voltage sector and means for using the correction term in correcting the digital value obtained from the analog-to-digital converter when the analog-to-digital converter is used to convert a signal included in the voltage sector from an analog into a digital form.

22 Claims, 7 Drawing Sheets

METHOD OF CALIBRATING AN ANALOG-TO-DIGITAL CONVERTER, AND A CALIBRATION EQUIPMENT

This application is a continuation of international application Ser. No. PCT/FI00/00790, filed Sep. 19, 2000.

FIELD OF THE INVENTION

The invention relates to analog-to-digital converters. The invention relates specially to calibrating an analog-to-digital converter.

BACKGROUND OF THE INVENTION

Telecommunications is one of the fastest-growing business areas and therefore an ever increasing amount of data is transferred through mobile and fixed telecommunication networks. Telecommunication systems are digital, but the world around them is analog; therefore we need analog-to-digital converters (ADCs). When we talk we produce an analog signal, and the voice we hear is also analog. In addition, electromagnetic radiation, which carries digital signals through the air from a mobile phone to a base station, is analog. However, these analog signals are processed in the digital format, because. the digital world is more tolerant for interference from various error sources. Another reason for processing signals in the digital format is that design automation of the digital circuits enables us to design more complex digital circuits.

The ADC is a device which converts a continuous analog signal into a discrete and quantified digital signal. The throughput of the ADC often limits the throughput of the digital system operating on analog inputs. Throughput is the number of conversions processed in a given period. The rate of information transmission cannot exceed the channel capacity (C). The maximum channel capacity can be calculated by applying the Harley-Shannon law. The maximum channel capacity C for a system having a bandwidth B and a signal-to-noise power ration $SNR^2$ is:

$$C = B\log(SNR^2 + 1).$$

The SNR can be increased by designing a more accurate ADC, which can process more information in a clock cycle. The bandwidth can be increased by adding speed, i.e. designing a converter having more clock cycles in a time unit.

For an ADC with high speed and high accuracy, pipeline architecture produces the best results. In the pipeline ADC, a few relatively simple pipeline stages are connected in series. Each of these stages produces a part of the total output bits of the ADC. The pipeline architecture is efficient in terms of power dissipation. Despite the fact that the power dissipation in a base station is not as critical a parameter as it is in a mobile phone, it still has to be seriously considered.

The matching of analog components, such as capacitors and transistors, is still a problem in the integrated circuits. Any mismatch reduces the yield. The mismatch can be measured, and the error it causes can be corrected by digital calculations, if some additional circuitry is implemented. This is called calibration. In addition to digital calibration, analog and mechanical calibration methods have been developed.

OBJECT OF THE INVENTION

The object of the present invention is provide a method for calibrating an analog-to-digital converter, which method is easy and fast to perform.

Another object of the present invention to provide an equipment for calibration of an analog-to-digital converter.

SUMMARY OF THE INVENTION

The present invention provides a method of calibrating an analog-to-digital converter, giving an initial value to a correction term of a digital value obtained in response to an analog signal supplied to the analog-to-digital converter, supplying an input to the analog-to-digital converter with an input voltage included in the voltage sector to be calibrated, said input voltage being selected such that a digital value corresponding to the input voltage is substantially of the same magnitude as a first digital value and a second digital value, supplying a first control code to the analog-to-digital converter, whereupon the first digital value is obtained as the output of the converter, supplying a second control code to the analog-to-digital converter, whereupon the second digital value is obtained as the output of the converter, calculating a residual of the voltage sector to be calibrated as a difference of the second and the first digital value, calculating a correction term related to the voltage sector, which correction term is the initial value of the correction term in the first voltage sector, by adding the correction term of the adjacent calibrated voltage sector to the residual of the voltage sector, storing in a memory the correction term related to the voltage sector, to be used in correcting the digital value obtained from the analog-to-digital converter with the correction term when the analog-to-digital converter is used to convert a signal included in the voltage sector of the voltage space from an analog into a digital form, replacing the voltage sector with the next voltage sector in the voltage space of the analog-to-digital converter, repeating the preceding seven steps until a correction term has been found for each voltage sector, reading from the converter the digital value obtained when the analog signal is converted into a digital signal, reading from the memory the correction term corresponding to the digital value, correcting said digital value with said correction term, repeating the preceding three steps during the conversion.

The present invention also provides a calibration equipment for calibrating an analog-to-digital converter, wherein the calibration equipment comprises means for giving an initial value to a correction term of a digital value obtained in response to an analog signal supplied to the analog-to-digital converter, means for supplying an input signal to the analog-to-digital converter with an input voltage included in the voltage sector to be calibrated, said input voltage being selected such that a digital value corresponding to the input voltage is substantially of the same magnitude as a first digital value and a second digital value, means for supplying a first control code to the analog-to-digital converter, whereupon the first digital value is obtained as the output of the converter, means for supplying a second control code to the analog-to-digital converter, whereupon the second digital value is obtained as the output of the converter, means for calculating a residual of the voltage sector to be calibrated as a difference of the second and the first digital value, means for calculating a correction term related to the voltage sector, which correction term is the initial value of the correction term in the first voltage sector, by adding the correction term of the adjacent calibrated voltage sector to the residual of the voltage sector, means for storing in a memory the correction term related to the voltage sector, to be used in correcting the digital value obtained from the analog-to-digital converter with the correction term when the analog-to-digital converter is used to convert a signal included in the voltage sector of the voltage space from an analog into a digital form, means for replacing the voltage sector with the next voltage sector in the voltage space of the analog-to-digital converter, means for repeating the preceding seven steps until a correction term has been found for each voltage sector, means for reading from the converter the digital value obtained when the analog signal is converted into a digital signal, means for reading from the memory the correction term corresponding to the digital value, means for correcting said digital value with said correction term, means for repeating the preceding three steps during the conversion.

The invention relates to calibration of analog-to-digital converter (ADC). In one preferred embodiment the ADC is a pipeline ADC. In the method according to the invention, the object is to split the voltage space of the ADC into input voltage sectors and find a correction term for digital output that is received as output to analog input. Then during analog-to-digital conversion the digital output can be corrected with the corresponding correction term. The calibration equipment presented by the invention can be manufactured to be inside the ADC to be calibrated or it can be external to ADC. The invention is not restricted to if the calibration equipment is internal or external.

Advantage of the present invention is that it provides a precise method for finding errors between the received and expected outputs in analog-to-digital converter. This creates basis for implementation of an high-resolution ADC.

BRIEF DESCRIPTION OF THE DRAWINGS

The present invention is explained in the following with reference to accompanying drawings, where.

DETAILED DESCRIPTION OF THE INVENTION

Figure 1A:
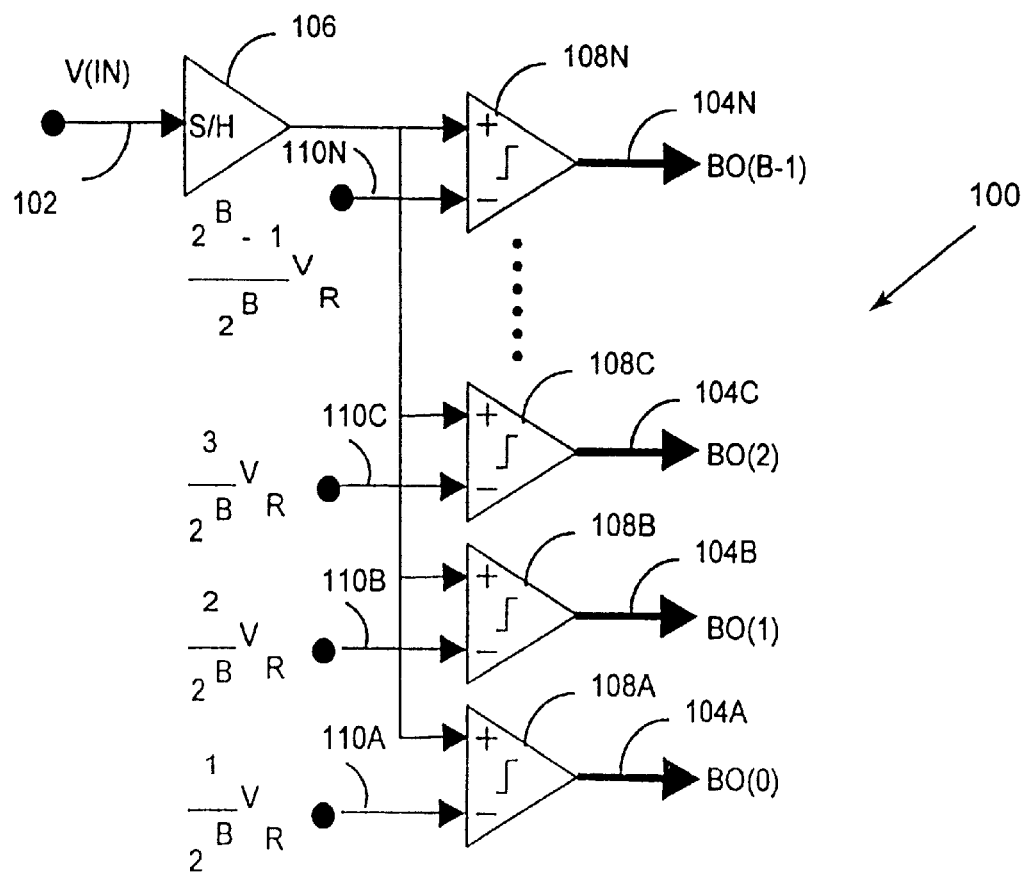
FIG. 1A is a view of a flash ADC.

The invention is explained in the following with reference to the accompanying drawings. FIG. 1 shows a simple flash ADC 100, which is the simplest analog-to-digital converter. As illustrated in FIG. 1, the flash ADC 100 consists of comparators 108A–108N, which compare an input voltage 102 to respective reference voltages 110A–110N. B is here the resolution in bits, 35 and the input range of the ADC 100 is from 0-V(R). V(IN) 102 is the analog input voltage, and BO(0)–BO(B−1) 104A–104N are the output bits from the comparators 108A . . . 108N, respectively. A sample and hold circuit (S/H) 106 is not necessary, but it improves the accuracy if high-frequency input signals 102 are converted. The reference voltages 110A–110N may be generated with a resistor string and voltage buffers.

Flash converters are the fastest ADCs, but their power consumption and the die area increase exponentially with increasing accuracy. Matching problems and problems caused by the increasing die area limit the accuracy of the flash ADC. In addition, a large number of comparators leads to a high power consumption. Only resolutions of up to 7 bits are practical for flash ADCs. A flash ADC with a 500 Ms/s conversion rate and accuracy of 6 bits has been reported. On the other hand, accuracy of 8 bits has been achieved with a 25 Ms/s conversion rate.

Figure 1B:
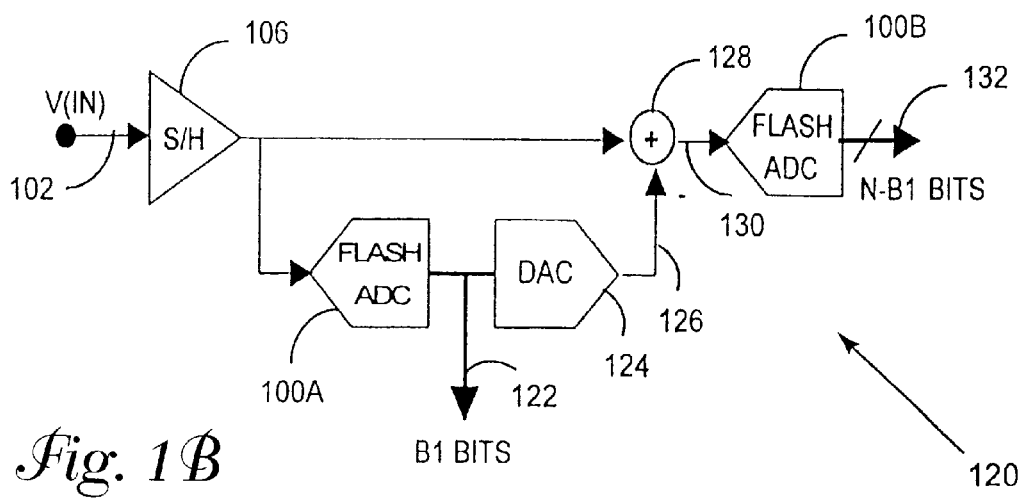
FIG. 1B is a view of a two-step flash ADC.

A more advanced ADC, that is, a two-step flash ADC 120, is shown in FIG. 1B. The conversion of the signal from analog to digital is done in two steps. The first step or the first flash ADC 100A produces B1 digital bits 122, which are then converted back to an analog voltage 126 by a digital-to-analog converter 124. The achieved voltage 126 is subtracted from the input voltage 102 by an adder 128, and the residue 130 is fed to the next flash ADC 100B. The second stage or second flash ADC 100B produces N−B1 less significant bits 132, where N refers to resolution in bits of the ADC, The two-step flash ADC 120 has a lower conversion speed than the simple flash ADC 100, but the two-step flash ADC 120 needs only $2.2^{N/2}$ comparators 108A–108N. As the two-step flash ADC 120 has less hardware and the conversion is done in two steps, it is possible to gain more accuracy. Accuracy of 12 bits with a 50 Ms/s sampling rate has been reported for a two-step flash ADC. The same accuracy has been achieved with the speed of 128 Ms/s as well. However, in this case the power dissipation was unpractically high.

If an ADC has more than two steps, it is called a multi-step or subranging ADC. Additional steps reduce the amount of hardware needed, but more time is required for the conversion. If a sample and hold function is added between the steps, the converter is then called a pipeline ADC. In the pipeline ADC, there are multiple samples undergoing conversion at the same time, whereas in the multi-step ADC only one sample is being converted at any given time. Most commonly used topology in the ADCs which have to have a high speed and high accuracy at the same time is the pipeline topology. Some manufacturers aim to achieve a 12-bit resolution without any calibration. Even a 14-bit calibration-free ADC has been reported. However, these kinds of resolutions set high requirements for the matching of the capacitors and the other components in the converter. The matching requirements can be reduced with calibration. Accuracy of 16 bits has been reported with calibration.

Figure 2:
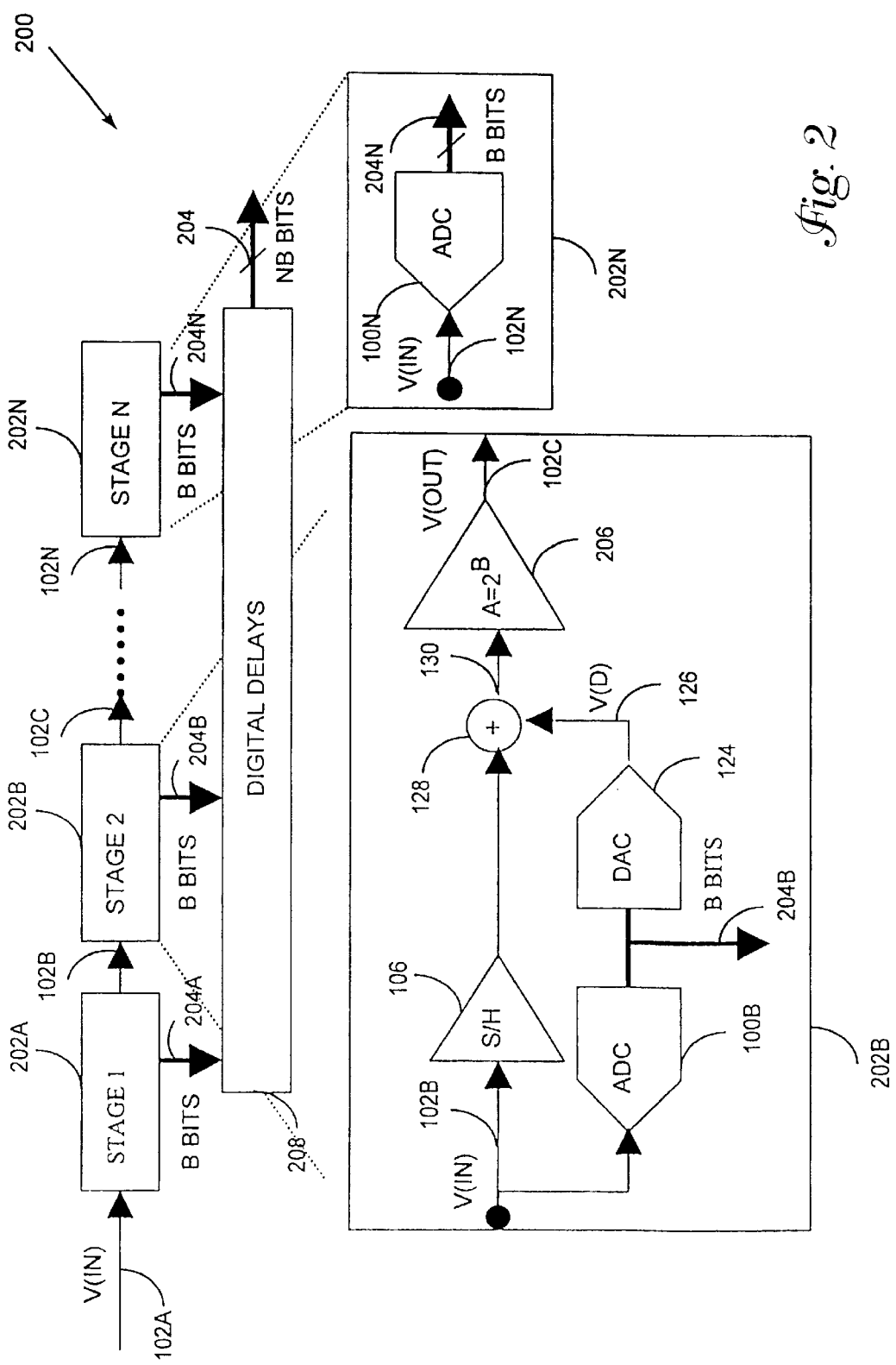
FIG. 2 is a view of a pipeline ADC.

A block diagram of a pipeline ADC 200 is given in FIG. 2. The bolder lines represent the digital signals, and the narrower lines are the analog signals. The converter consists of N pipeline stages 202A–202N. The sampled analog input signal 102A is processed in a first stage 202A and then fed to a second pipeline stage 202B and further to the later stages. The ADC 100A inside the pipeline stage 202B converts the analog input 102B into a B-bit digital word 204A. The flash topology is usually used for the ADC 100A, because the most critical property is the conversion speed. The MSB bits are converted in the first stage 202A and the LSB bits in the $n^{th}$ stage 202N. The digital-to-analog converter (DAC) 124 converts the digital word 204B back to an analog voltage V(D) 126. This voltage 126 is then subtracted in the adder 128 from the input voltage V(IN) 102A and the result 130 is amplified in the amplifier 206 with the gain of $2^B$. The following stage samples the amplified voltage 102C. Stages 202A–202N−1 from 1 to n−1 are similar. The last stage 202N only converts its input voltage 102N to B LSB bits 204N. The digital output word 204 of the ADC 200 is ready when the comparison function of the last stage 202N is finished. The digital delay block 208 introduces different delays to the outputs of the different pipeline stages 202A . . . 202N, so that every bit of the conversion result is simultaneously available at the output.

The resolution of the converter 200 of FIG. 2 is simply the number of stages N multiplied by the resolution B of a stage 202A... 202N. In principle, increasing the resolution of a pipeline ADC is easy to do by merely adding pipeline stages. But, of course, the non-idealities of the blocks begin to limit the accuracy at some point. Adding the resolution by adding stages has no effect on the sampling frequency $f_s$, or the throughput. Instead, the latency, the power dissipation and the die area increase linearly.

A pipeline ADC has some typical error sources, which limit the performance of the ADC. Some of these errors can be partly corrected with additional circuitry. Error in the transfer function of pipeline stage is typically one of the following: a) gain error, b) comparator offset error, c) offset of the pipeline stage, d) error from the finite gain of the operational amplifier. The mismatch of the capacitors is the most usual source of the gain error. When there are offset errors e.g. in two of the three comparators, the output of the first comparator changes at too low an input voltage, i.e. the comparator has offset $V_{off}$. This causes the output of the DAC to change at a wrong analog input value. Because the subtraction function is executed at wrong values, the amplification causes the output voltage to exceed the input voltage range of the next stage. Errors in the reference voltage of the comparators have the same effect as the offset errors of the comparators.

An error in a pipeline stage may cause the output voltage to exceed the input range of the next stage, leading to missing decision levels. These cannot be corrected with a digital correction algorithm. Missing codes, on the other hand, appear when the maximum of the output is less than the highest or the minimum of the output is more than the lowest comparison point of the next pipeline stage. In this case, some values of the digital output are never reached. Missing codes can be corrected with digital correction if the circuit has enough redundancy in the number of decision levels, i.e. comparators.

The typical error sources in a pipeline ADC and the methods to reduce the effects of these errors during conversion may be conveniently summarized by means of Table 1.

TABLE 1

Error sources in the pipeline ADC.

| WAY TO REDUCE ERROR | ERROR |
| --- | --- |
| Digital correction | The offset and reference voltage errors of comparators |
| Calibration | C-mismatch |
| | Finite op-amp gain |
| | Reduced interstage gain |
| | Charge injection |
| | Comparator offset |
| Not correctable | Clock jitter |
| | Incomplete settling |
| | Noise |

The easiest way to design an ADC is to keep all of the stages alike. However the performance of the stages towards the LSB stage can optimized by means of scaling. Scaling means that less accurate pipeline stages are used for the LSB stages. Scaling is used because more errors and noise are allowed in the later pipeline stages than in the first one. This is due to the amplification function of a pipeline stages. Typical targets to the scaling are the sizes of the capacitors and the power consumption of the operational amplifiers. A pipeline stage generates less noise with larger capacitors, but the power consumption and the die area are smaller with smaller capacitors. The kT/C noise, i.e. the thermal noise, or the matching of the capacitors defines the minimum allowable sampling capacitor size. If calibration is used to reduce the errors caused by inadequate matching, noise limits the size of the capacitors. The price we have to pay for scaling is increased design time and complexity, as the designer has to design multiple pipeline stages instead of designing just one stage and then copying it. Minimum additional design effort is needed, if only two different kinds of pipeline stages are used. This means that a couple of stages from the beginning of the pipeline are larger ones and the rest of the stages are smaller ones. However, more efficient results in terms of the power consumption or in terms of the die area are achieved if each stage is scaled down with a scaling factor, compared to the previous stage. If the scaling factor is equal to the square of the interstage gain, each stage contributes an equal amount of noise to the input and dissipates a different amount of power. This may lead to impractically large power dissipation in the first stage. When scaling factor 'one' is used, all the stages are equal and dissipate an equal amount of power, but most of the input-reduced noise power comes from the MSB stage. The optimum factor is somewhere between the square of the interstage gain and 'one'. Because the last stages of the pipeline have only a minor effect on accuracy, it is sensible to stop the scaling at some point of the pipeline.

Calibration can be defined as measuring the errors of the ADC as a function of a quantity at the calibration phase, and using later this information to correct the output of the circuit. In digital calibration circuitry the measured errors are saved in a memory and processed by digital logic. While converting, the ADC uses these measured values and values from the conversion to calculate the corrected output. Calibration enables the correction of the static errors of an ADC. Calibration can be considered automatic electrical trimming. Trimming of the IC circuits has been used to improve the matching of the components or to produce components with accurate absolute values. Trimming has typically been made only once after the fabrication. Trimming has been done, for example, with a laser beam. The drawback of trimming is that it slows down the testing of the chips due to the trimming actions needed; thus, trimming increases costs in mass production. Calibration, on the other hand, is executed automatically at least once after each power-up of the chip. Therefore it does not require any extra operations in fabrication, and some effects of aging and even a change in the environment of the device can be taken into account. Re-calibrating at times can reduce the errors caused by a change in the operation conditions. A pipeline converter with a calibration algorithm requires some extra stages to avoid the errors of the finite word length in the digital calculations and to provide the redundancy needed. In general, despite all possible errors an ADC must provide decision levels, which are separated less than one LSB of the conversion resolution, to enable the correction of the errors.

Figure 3A:
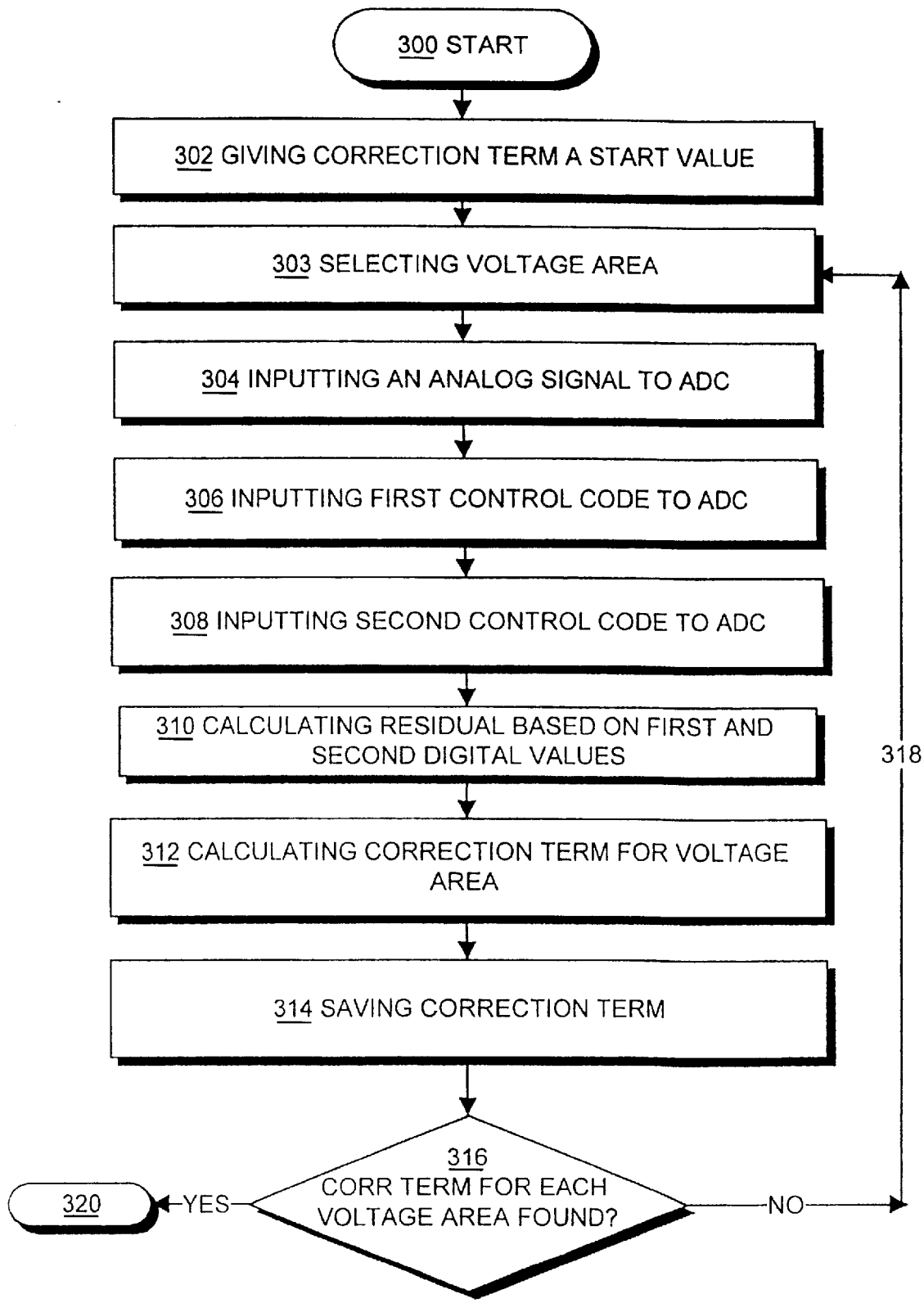
FIGS. 3A and 3B show a view of the method according to the invention.
Figure 3B:
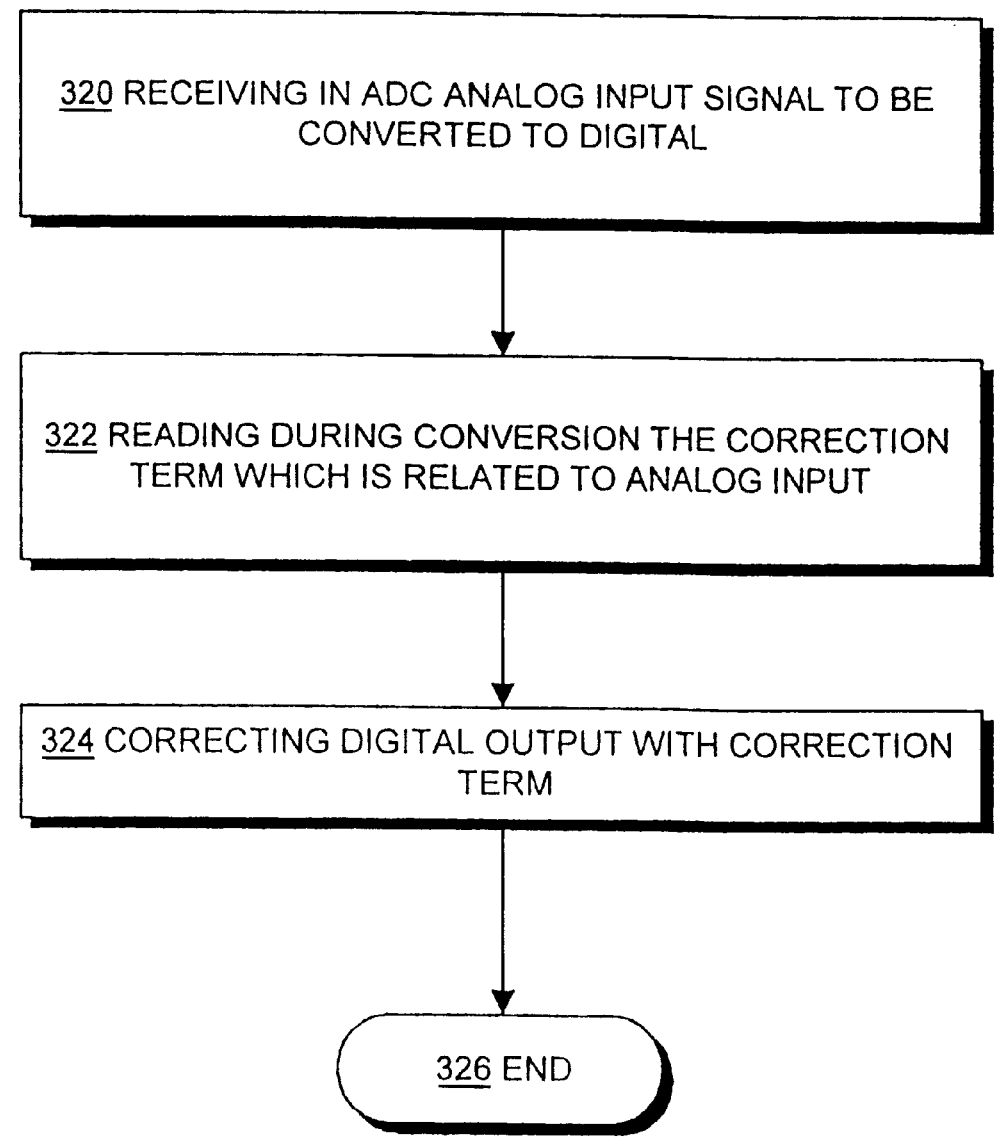

The purpose of the invention is to introduce a new method and equipment for calibration of an ADC. The invention is now described by first referring to the method description shown in FIGS. 3A and 3B In an initial step 300, the voltage space V is divided into smaller voltage sectors, V0–VN. Voltage space refers here to the voltage range which comprises the analog voltages the ADC is able to convert. Voltage space V is preferably divided to voltage sectors V0–VN according to the number of categories given by the MSB bits to be calibrated. The, for example, if 3 most significant bits were calibrated, there would be 8 voltage sectors. In step 302 an initial value m(0) is set for the correction term of the voltage sector V0, which is first calibrated. In a preferred embodiment the initial value is set to zero (0), that is m(0)=0. In another preferred embodiment an input signal belonging to the voltage sector V0 is inputted to the ADC. Then the corresponding digital value is read. Finally, the residual between the received digital value and the ideal digital value is calculated and used later as a correction term m(0) for the voltage sector V0. After the initial value m(0) has been obtained in step 302, the second voltage sector V1 is selected in step 303. In a preferred embodiment, the calibration starts from the minimum voltage of the voltage space V, in another embodiment the calibration begins from the middle of the voltage space V of the ADC. However, the invention is not restricted to the voltage sector V0–VN from which the calibration starts. The calibration continues in step 304, where an analog input voltage is inputted to the ADC. The analog voltage is chosen such that the digital value corresponding the input voltage is substantially of the same magnitude than the first digital value and the second digital value. In a preferred embodiment the input voltage is chosen such that the digital output value given by the analog input is substantially in the middle of the mentioned two digital values. The first digital value refers herein to the digital value that is received when a first control code is inputted to the ADC. The second digital value refers herein to the digital value that is received when a second control code is inputted to the ADC. In the next step 306, the first control code is inputted to the ADC and the received digital value do(1) is stored. In step 308 the second control code is inputted to the ADC and the digital value do(2) is read. The residual e(1) of the two values is then calculated in step 310 as e(1)=do(2a)−do(1a). A correction term m(1) for voltage area V1 is now obtained in step 312 as m(0)−e(1). Table 2 illustrates the calculation of the correction terms m based on residuals e.

TABLE 2

Calculation of correction terms

| Voltage sector/address | Correction term, m(N) |
|---|---|
| 000 | m(0) = e(0) |
| 001 | m(1) = m(0) − e(1) |
| 010 | m(2) = m(0) − e(2) |

In a preferred embodiment the address of the correction term in the memory is indicated by the digital output as shown in Table 2. Thus, if the voltage sector V0 in Table 2 is indicated by the digital output '000', the correction term m(0) is stored in the memory location '000'. In step 316 it is checked if correction terms have been found for each voltage sector V1–VN. If there is still a correction term for a voltage sector to be found, steps 303 to 314 are repeated. When the answer is positive in step 316, the calibration is finished. The calibration information is utilized in steps 320–324, where the analog input is converted to digital. First in step 322, the analog input is received. In step 322 the correction term, which relates to the analog input, is read from the memory. In a preferred embodiment the correction term is read from the memory location indicated by the digital output bits. Finally in step 324, the digital output is corrected with the correction term associated with the digital output. The corrected digital output for voltage area N with correction term m(N) can be illustrated by the formula D(c)=D(r)+m(N), where D(c) means the corrected digital output and D(r) the digital output without correction.

Figure 4:
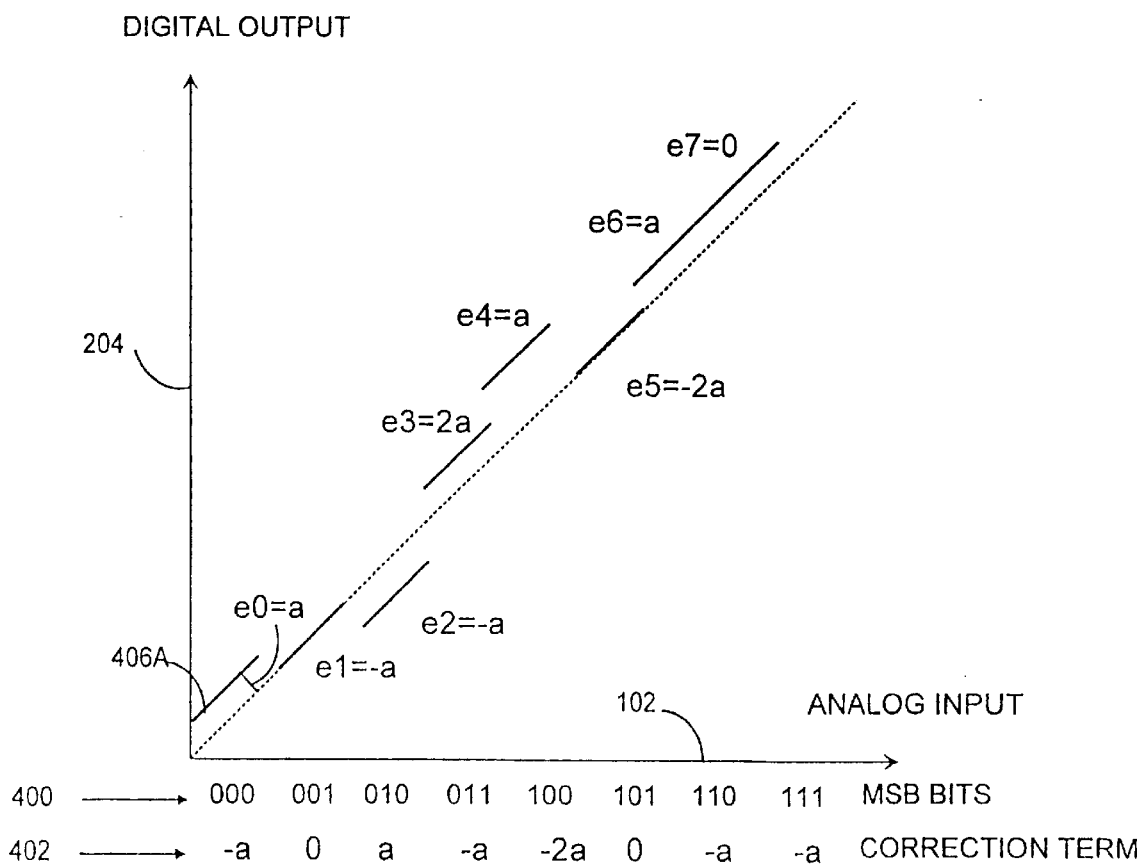
FIG. 4 shows residuals of a digital output as a function of an analog input.

FIG. 4 illustrates the digital output as a function of the analog input. The analog input 102 is shown on the x-axis and the digital output 204 on the y-axis. The analog input 102 is also shown below the x-axis as reference to the corresponding most significant bits (MSB) of the digital output 400. It can be seen that when the analog input 102 corresponds to digital output '000', the residual e0 is equal to 'a'. Here 'a' denotes the difference between a measured output 406A and an ideal output 404. A correction term 406 for the analog input '000' is thus '−a' to compensate for the error residual 'a' in the ADC.

Figure 5:
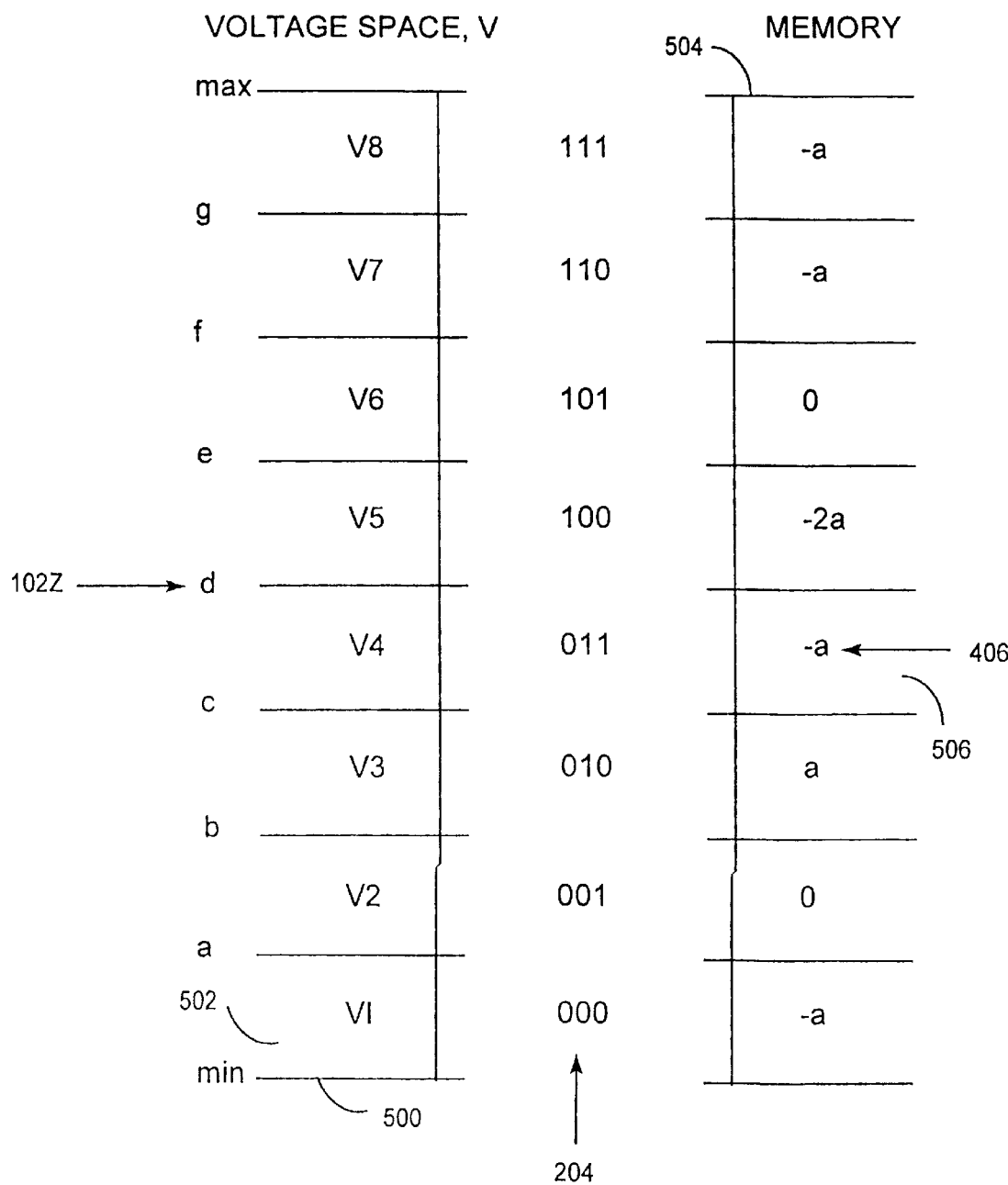
FIG. 5 is a view of voltage space of the ADC and how it is divided into voltage areas.

FIG. 5 clarifies further the concepts of 'voltage space' and 'voltage sector' with reference to the invention. A voltage space 500 of the ADC is a group of voltages that the ADC is able to convert. In FIG. 5, the voltage space 500 of the ADC includes all input voltages between voltages 'min' and 'max'. Voltage sectors 502 are shown as V1 to V8. When the input voltages used in the calibration are denoted with letters a–g, the first voltage sector V1 is defined by voltages between 'min' and 'a'. The second voltage sector V2 is defined as voltages between 'a' and 'b', and so on. Most significant bits of the digital outputs 204 corresponding to the analog inputs are shown in the middle of FIG. 4. A memory 504 shows, how correction term 402 is stored into a memory location 506.

As an example of calibration of voltage sector V5 of an ADC, the input voltage is 'd' and the correction term of the previously calibrated voltage sector V4 is m(4). If the voltage is presented for example with 10 bits, voltage 'd' would be '1000000000'. It is seen how 'd' is selected to be substantially between voltage sectors V4 and V5. The first control code in this example is '011' (with reference to V4) and the second control code is '100' (with reference to V5). From the digital outputs of the first and second control codes the residual e(5) is calculated and then the correction term m(5) for V5 as m(5)=m(4)+e(5).

Figure 6:
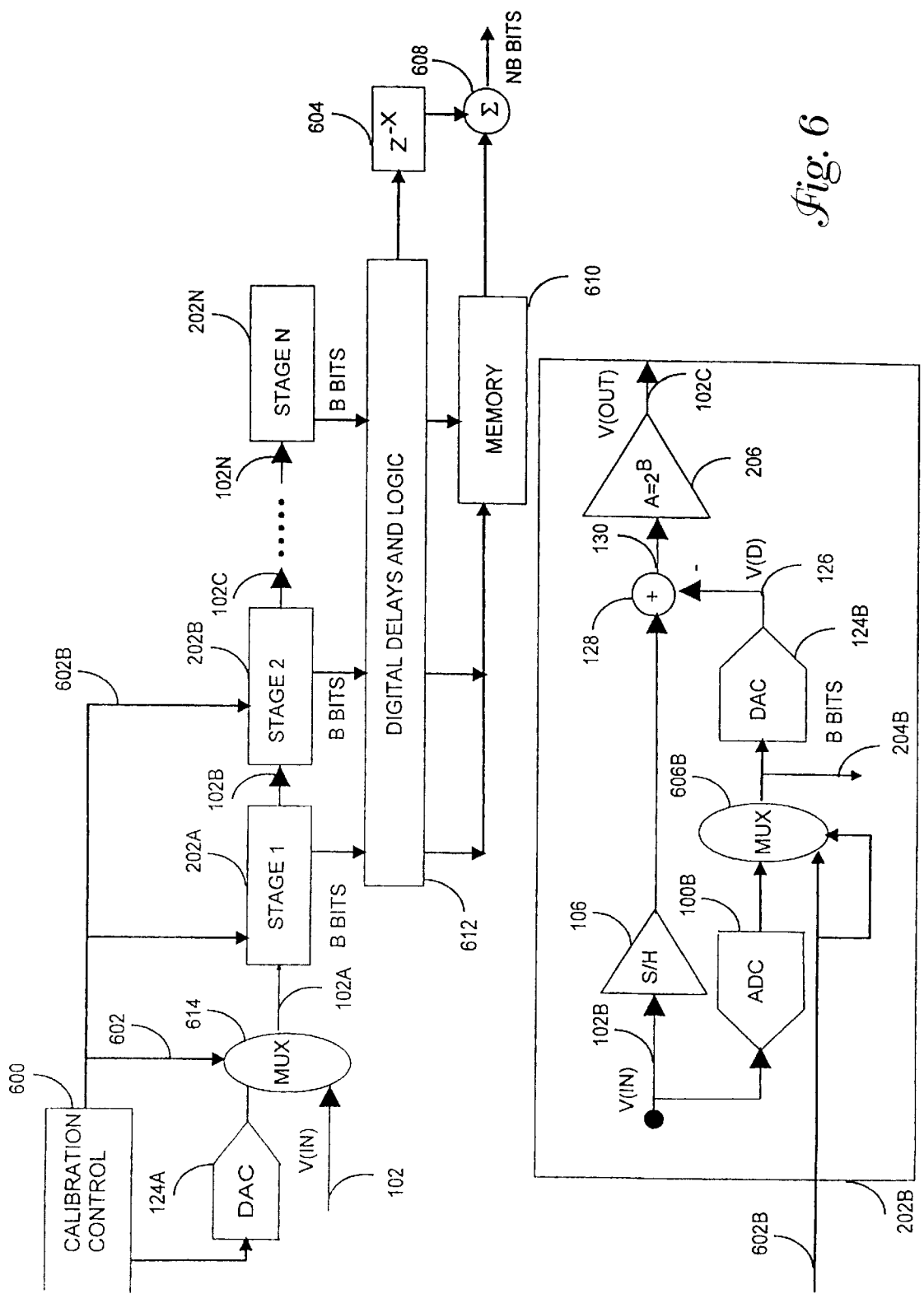
FIG. 6 shows a preferred embodiment of the pipeline ADC according to the invention.

The equipment according to the invention is now described with reference to a preferred embodiment shown in FIG. 6. FIG. 6 shows a pipeline ADC and a calibration equipment connected to the ADC. In the figure bold lines represent digital information and narrow lines mean analog information. The calibration equipment consists essentially of calibration control 600, a delay block 602, a digital-to-analog converter 124A, multiplexing units 606A–606N and 614, memory 610, digital delays and logic, delay unit 604 and adder 608. Calibration control 600 takes care of calibration coordination. One task of calibration control is to coordinate the analog signal input to the ADC during calibration. Thus selection of the currently calibrated section is also one task of the calibration control. The calibration coordination also gives the initial value for the correction term of a voltage sector. In a preferred embodiment the feeding of the analog input is done with a digital-to-analog converter DAC. The analog signal passes through multiplexing unit 614 before entering the first pipeline stage 202A. Multiplexing unit 614 receives analog input either from DAC 124A during the calibration or from V(IN) 102 during conversion. Multiplexing unit 614 also receives a direct digital input 602 from the calibration control 600 which digital information 602 contains the information which of the analog inputs multiplexing unit shall select. One pipeline stage 202B is shown in more detail in the figure. It is seen that multiplexing unit 606B has an input from a sub-ADC 100B and also from the calibration control 600. The calibration control 600 provides multiplexing unit 606B with control codes 602B via the digital connection. According to digital information 602B, multiplexing unit 606B can make a decision whether to utilize the information received from the comparators in the ADC 100B or whether to replace the comparator information with the control codes. The multiplexing unit 606B is present only in stages to be calibrated. If e.g. the ADC has resolution N=12, the number of stages to be calibrated would be 12/3=4. Number of stages to be calibrated is preferably N/2 or N/3, but can be some other figure also. The DAC 606B, the summing 128 and the amplification 206 functions of a pipeline stage implemented with switched capacitor technology (SC-technology) are executed by connecting capacitors operational amplifier and appropriate reference voltages. The analog functions of the calibrated pipeline stages are executed with same connections for each input voltage, which belongs to one voltage sector. In the adjacent sectors these connections are lightly different and also different errors occur. These differences in errors are measured. The ADC stages produce bits according to the analog input information, and the bits are passed to the digital delays and logic unit 612. The digital delays and logic 612 calculates residuals and correction terms. The digital delays and logic 612 has an interface to the memory 610, where it stores the correction terms which relate to different voltage sectors. During the analog-to-digital conversion, correction terms are read from the memory 610 locations corresponding to the comparator outputs. During the analog-to-digital conversion, the delay unit 604 reads the digital output data which has not been corrected with the correction terms. The delay unit 604 causes to the digital output also some delay if needed such that the digital output and correction term associated to the digital output are read simultaneously in the adder 608. The adder 608 receives as input the uncorrected and possibly delayed input signal from the delay unit 604 and the corresponding correction terms from the memory 610. The adder 608 sums these inputs and gives the digital output bits NB corrected with the correction terms.

The components needed for the calibration are preferably inside the ADC to be calibrated but the invention is not restricted to such an embodiment. Calibration equipment can also be external to the ADC. The components used in the calibration can be implemented in software but also as separate logic components or as ASIC components. For a person skilled in the art, it is clear that ADC can also contain other components than the ones shown in the accompanying figures, but it is not essential for the invention to describe them. The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of calibrating an analog-to-digital converter, wherein
    giving an initial value to a correction term of a digital value obtained in response to an analog signal supplied to the analog-to-digital converter,
    supplying an input to the analog-to-digital converter with an input voltage included in the voltage sector to be calibrated, said input voltage being selected such that a digital value corresponding to the input voltage is substantially of the same magnitude as a first digital value and a second digital value,
    supplying a first control code to the analog-to-digital converter, whereupon the first digital value is obtained as the output of the converter,
    supplying a second control code to the analog-to-digital converter, whereupon the second digital value is obtained as the output of the converter,
    calculating a residual of the voltage sector to be calibrated as a difference of the second and the first digital value,
    calculating a correction term related to the voltage sector, which correction term is the initial value of the correction term in the first voltage sector, by adding the correction term of the adjacent calibrated voltage sector to the residual of the voltage sector,
    storing in a memory the correction term related to the voltage sector, to be used in correcting the digital value obtained from the analog-to-digital converter with the correction term when the analog-to-digital converter is used to convert a signal included in the voltage sector of the voltage space from an analog into a digital form,
    replacing the voltage sector with the next voltage sector in the voltage space of the analog-to-digital converter,
    repeating the preceding seven steps until a correction term has been found for each voltage sector,
    reading from the converter the digital value obtained when the analog signal is converted into a digital signal,
    reading from the memory the correction term corresponding to the digital value,
    correcting said digital value with said correction term,
    repeating the preceding three steps during the conversion.

2. A method according to claim 1, wherein
    supplying a signal to the analog-to-digital converter with an input voltage included in the first voltage sector, when the initial value of the correction term for the digital value is being calculated,
    reading the digital value converted from the input voltage,
    calculating the residual between the digital value obtained as an output and the ideal digital value corresponding to the input voltage,
    storing in the memory the correction term that is equal to the residual, to be used in correcting a digital value obtained from the analog-to-digital converter with the correction term when the analog-to-digital converter is used to convert a signal included in the first voltage sector of the voltage space from an analog into a digital form, said correction term being further applicable as an initial value in the calibration when the correction terms of the following voltage sectors are calculated.

3. A method according to claim 1, wherein
    setting zero as the initial value of the correction term for the digital value.

4. A method according to claim 1, wherein
    selecting the first voltage sector substantially from the middle of the voltage space,
    forming correction terms for one or more voltage sectors, which are at higher voltage levels than the middle of the voltage space in the analog-to-digital converter,
    forming correction terms for one or several voltage sectors, which are at lower voltage levels than the middle of the voltage space in the analog-to-digital converter.

5. A method according to claim 1, wherein controlling, with the control code supplied to the analog-to-digital converter, the operation of the analog-to-digital converter such that the output of one or more comparators is replaced in the analog-to-digital converter with bits that are dependent on the control code.

6. A method according to claim 1, wherein
    forming the first digital value at least twice, and forming a first average on the basis of said two or more digital values, forming the second digital value at least twice, and forming a second average on the basis of said two or more digital values, calculating the residual as a difference of the second and the first average.

7. A method according to claim 1, wherein forming the residual of the voltage sector to be calibrated at least twice, forming an average of the residual by means of the two or more residuals formed in the preceding step, said average being utilized in calculating the correction term of the voltage sector.

8. A method according to claim 1, wherein subtracting from the residual a digital value corresponding to a least significant bit of the analog-to-digital converter, when the correction term for the digital value is being calculated.

9. A method according to claim 1, wherein storing the correction term of the voltage sector in a memory location indicated by outputs of one or more comparators, reading the correction term of the voltage sector from the memory location indicated by outputs of one or more comparators during the conversion.

10. A method according to claim 1, wherein forming the analog voltage supplied to the analog-to-digital converter with a digital-to-analog converter.

11. A method according to claim 1, wherein the analog-to-digital converter is a pipeline analog-to-digital converter.

12. A calibration equipment for calibrating an analog-to-digital converter, wherein the calibration equipment comprises means for giving an initial value to a correction term of a digital value obtained in response to an analog signal supplied to the analog-to-digital converter, means for supplying an input signal to the analog-to-digital converter with an input voltage included in the voltage sector to be calibrated, said input voltage being selected such that a digital value corresponding to the input voltage is substantially of the same magnitude as a first digital value and a second digital value, means for supplying a first control code to the analog-to-digital converter, whereupon the first digital value is obtained as the output of the converter, means for supplying a second control code to the analog-to-digital converter, whereupon the second digital value is obtained as the output of the converter, means for calculating a residual of the voltage sector to be calibrated as a difference of the second and the first digital value, means for calculating a correction term related to the voltage sector, which correction term is the initial value of the correction term in the first voltage sector, by adding the correction term of the adjacent calibrated voltage sector to the residual of the voltage sector, means for storing in a memory (610) the correction term related to the voltage sector, to be used in correcting the digital value obtained from the analog-to-digital converter with the correction term when the analog-to-digital converter is used to convert a signal included in the voltage sector of the voltage space from an analog into a digital form, means for replacing the voltage sector with the next voltage sector in the voltage space of the analog-to-digital converter, means for repeating the preceding seven steps until a correction term has been found for each voltage sector, means for reading from the converter the digital value obtained when the analog signal is converted into a digital signal, means for reading from the memory the correction term corresponding to the digital value, means for correcting said digital value with said correction term, means for repeating the preceding three steps during the conversion.

13. A calibration equipment according to claim 12, wherein the calibration equipment comprises means for supplying a signal to the analog-to-digital converter with an input voltage included in the first voltage sector, when the initial value of the correction term for the digital value is being calculated, means for reading the digital value converted from the input voltage, means for calculating the residual between the digital value obtained as an output and the ideal digital value corresponding to the input voltage, means for storing in a memory the correction term that is equal to the residual, to be used in correcting a digital value obtained from the analog-to-digital converter with the correction term when the analog-to-digital converter is used to convert a signal included in the first voltage sector of the voltage space from an analog into a digital form, said correction term being further applicable as an initial value in the calibration when the correction terms of the following voltage sectors are calculated.

14. A calibration equipment according to claim 12, wherein the calibration equipment comprises means for setting zero as the initial value of the correction term for the digital value.

15. A calibration equipment according to claim 12, wherein the calibration equipment comprises means for selecting the first voltage sector substantially from the middle of the voltage space, means for forming correction terms for one or more voltage sectors, which are at higher voltage levels than the middle of the voltage space in the analog-to-digital converter, means for forming correction terms for one or several voltage sectors, which are at lower voltage levels than the middle of the voltage space in the analog-to-digital converter.

16. A calibration equipment according to claim 12, wherein the calibration equipment comprises means for controlling, with the control code supplied to the analog-to-digital converter, the operation of the analog-to-digital converter such that the output of one or more comparators is replaced in the analog-to-digital converter with bits that are dependent on the control code.

17. A calibration equipment according to claim 12, wherein the calibration equipment comprises means for forming the first digital value at least twice, and forming a first average on the basis of said two or more digital values, means for forming the second digital value at least twice, and forming a second average on the basis of said two or more digital values, means for calculating the residual as a difference of the second and the first average.

18. A calibration equipment according to claim 12, wherein the calibration equipment comprises
- means for forming the residual of the voltage sector to be calibrated at least twice,
- means for forming an average of the residual by means of the two or more residuals formed in the preceding step, said average being utilized in calculating the correction term of the voltage sector.

19. A calibration equipment according to claim 12, wherein the calibration equipment comprises
- means for subtracting from the residual a digital value corresponding to a least significant bit of the analog-to-digital converter, when the correction term for the digital value is being calculated.

20. A calibration equipment according to claim 12, wherein the calibration equipment comprises
- means for storing the correction term of the voltage sector in a memory location indicated by outputs of one or more comparators,
- means for reading the correction term of the voltage sector from the memory location indicated by outputs of one or more comparators during the conversion.

21. A calibration equipment according to claim 12, wherein the calibration equipment comprises
- means for forming the analog voltage supplied to the analog-to-digital converter with a digital-to-analog converter.

22. A calibration equipment according to claim 12, wherein
- the analog-to-digital converter is a pipeline analog-to-digital converter.

* * * * *